United States Patent [19]

Lin et al.

[11] Patent Number: 5,450,331
[45] Date of Patent: Sep. 12, 1995

[54] METHOD FOR VERIFYING CIRCUIT LAYOUT DESIGN

[75] Inventors: Pei Lin, San Jose; Herve G. Duprez, Campbell, both of Calif.

[73] Assignee: VLSI Technology, Inc., San Jose, Calif.

[21] Appl. No.: 825,490

[22] Filed: Jan. 24, 1992

[51] Int. Cl.⁶ .............................................. G06F 15/60
[52] U.S. Cl. ..................... 364/490; 364/489; 364/488
[58] Field of Search ............... 364/488, 489, 490, 491, 364/578; 371/23; 395/500

[56] References Cited

U.S. PATENT DOCUMENTS

| | | | |
|---|---|---|---|
| 4,554,625 | 11/1985 | Otten | 364/491 |
| 4,791,586 | 12/1988 | Maeda et al. | 364/491 |
| 4,805,113 | 2/1989 | Ishii et al. | 364/491 |
| 4,829,446 | 5/1989 | Draney | 364/488 |
| 4,872,103 | 10/1989 | Kingsley | 364/491 |
| 4,918,614 | 4/1990 | Modarres et al. | 364/490 |
| 5,062,054 | 10/1991 | Kawakami et al. | 364/491 |
| 5,065,355 | 11/1991 | Hayase | 364/491 |
| 5,113,451 | 5/1992 | Chapman et al. | 382/8 |
| 5,151,868 | 9/1992 | Nishiyama et al. | 364/490 |
| 5,202,841 | 4/1993 | Tani | 364/491 |

OTHER PUBLICATIONS

"Programs for Verifying Circuit Connectivity of MOS/LSI Mask Artwork" by Takashima et al., IEEE 19th Design Automation Conference 1982, pp. 544–550.

Primary Examiner—Vincent N. Trans
Attorney, Agent, or Firm—Burns, Doane, Swecker & Mathis

[57] ABSTRACT

The present invention is directed to methods to assist designing integrated circuits by verifying that design constraints (e.g., minimum path width) are satisfied between two arbitrary nodes of a circuit layout. In an exemplary embodiment, a method for designing an integrated circuit layout by verifying that predetermined design constraints are satisfied for an arbitrary path defined by at least two nodes, comprises the steps of labeling all polygons of the integrated circuit layout with a name which corresponds to a layer of the integrated circuit layout in which each polygon is located, creating a file of polygons which includes polygons located along the arbitrary path, and determining whether polygons located along the arbitrary path satisfy predetermined design constraints specified for that path.

15 Claims, 4 Drawing Sheets

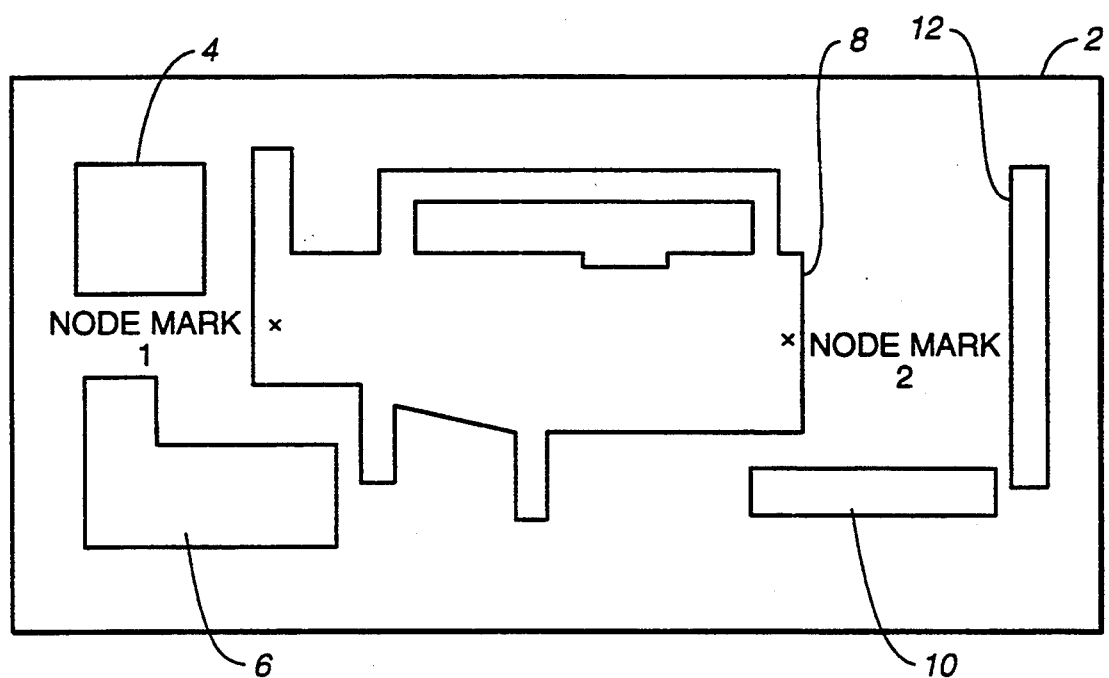
FIG._1A
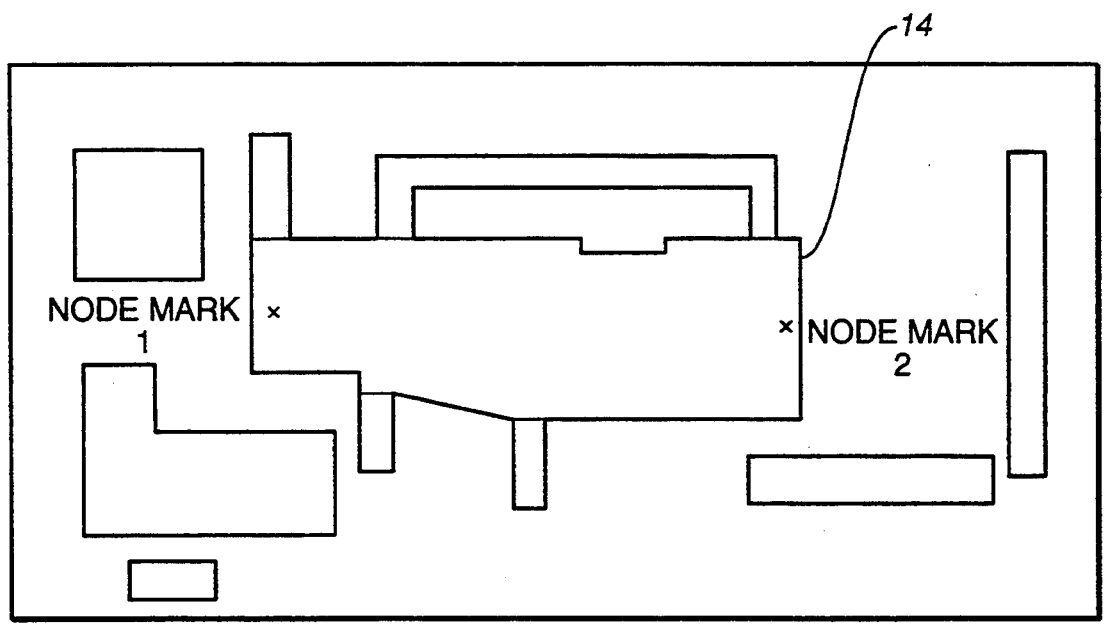
FIG._1B

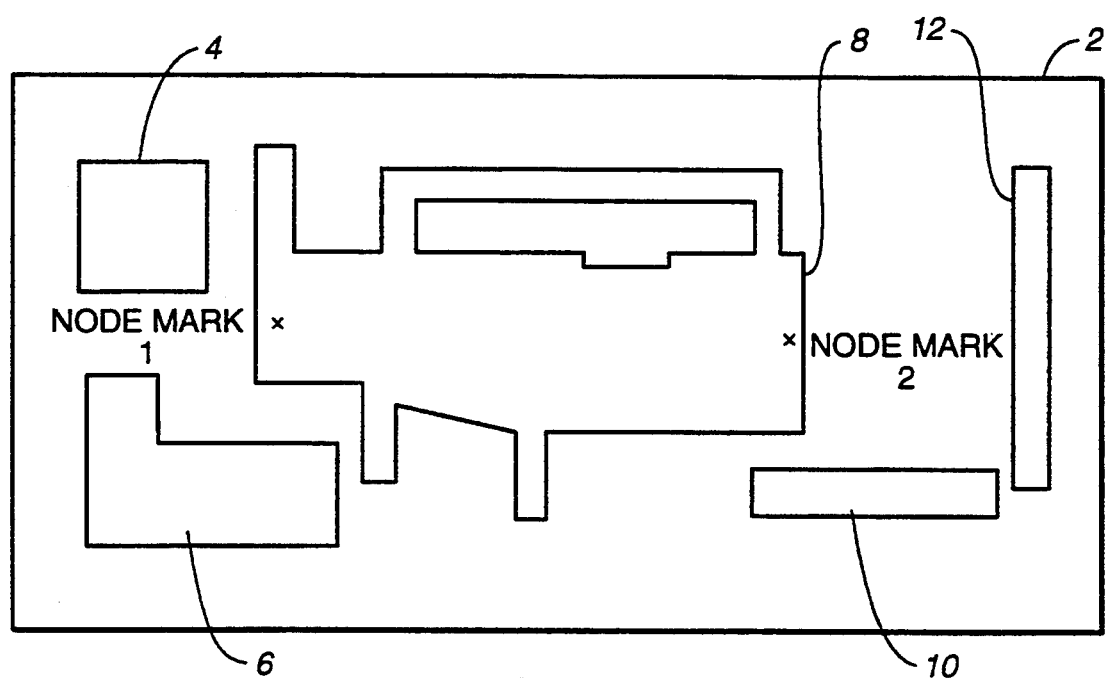
FIG._2A
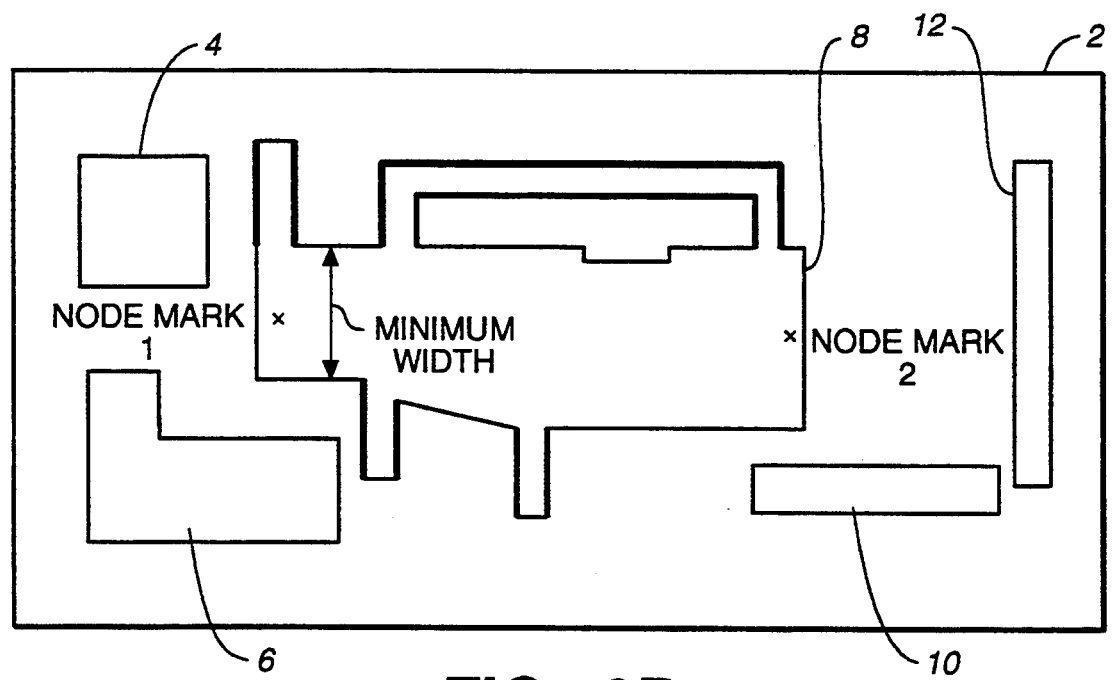
FIG._2B

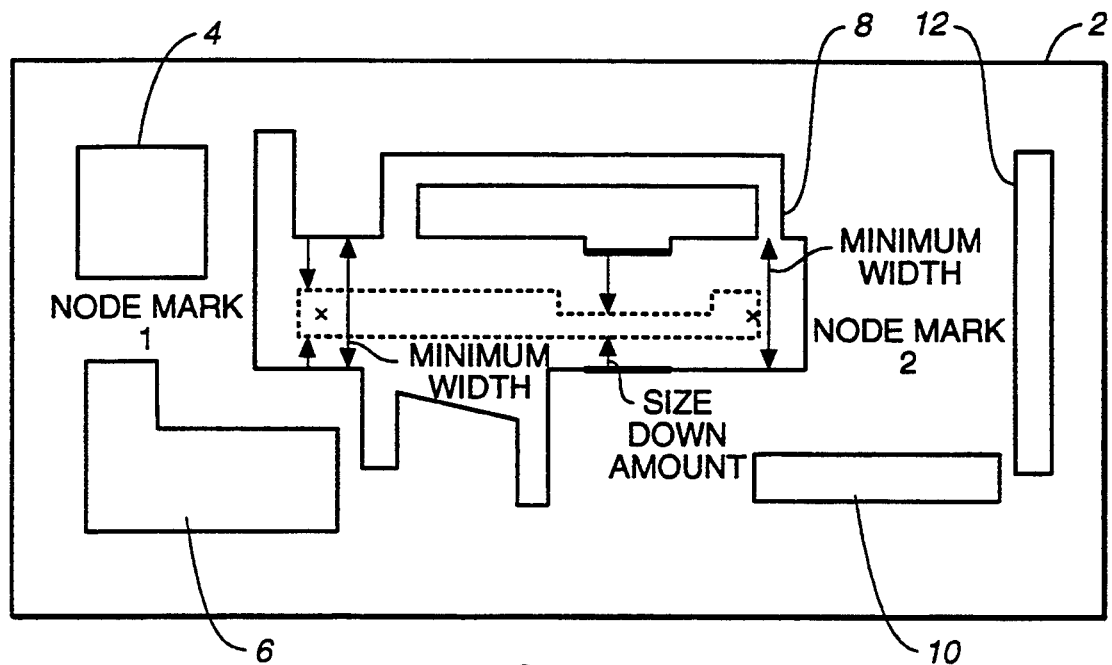
FIG._3A
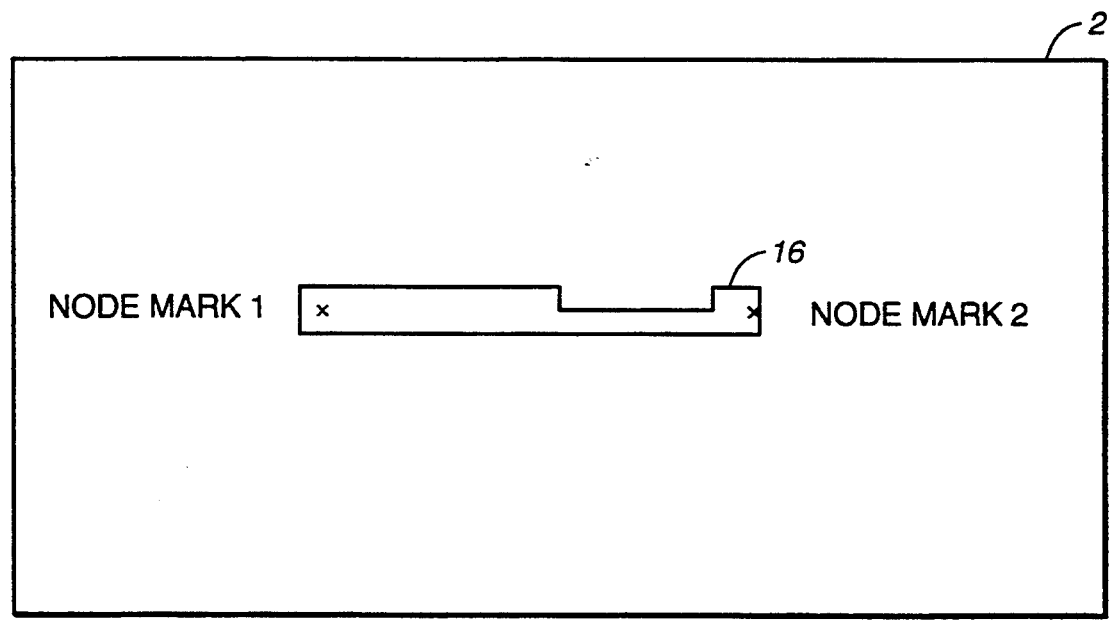
FIG._3B

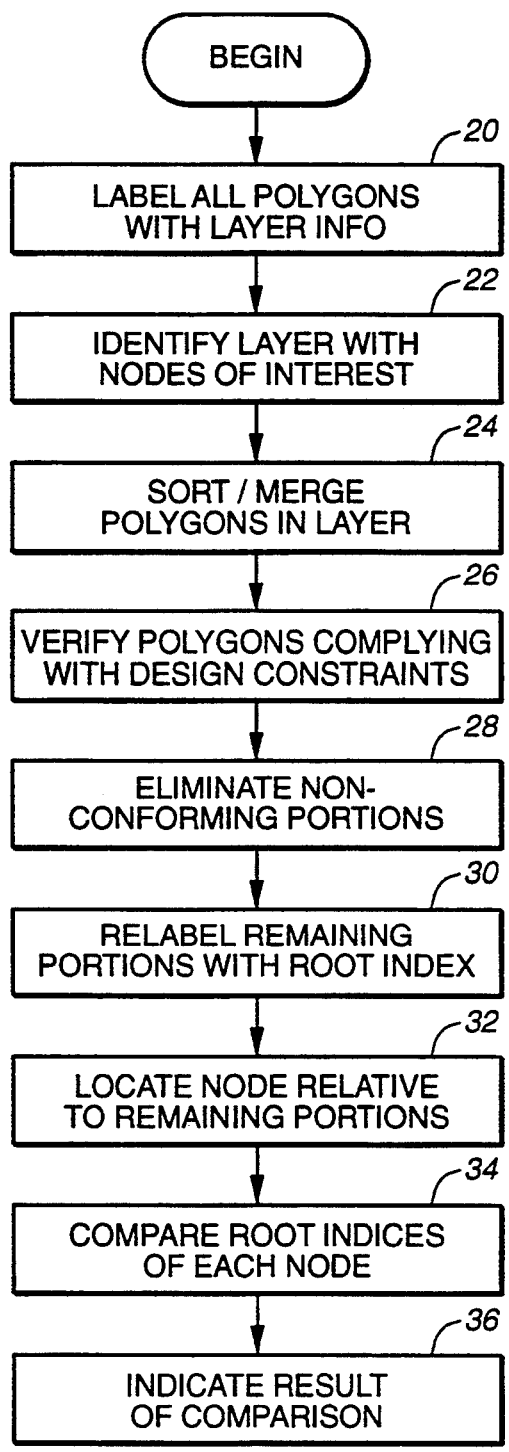
FIG._4
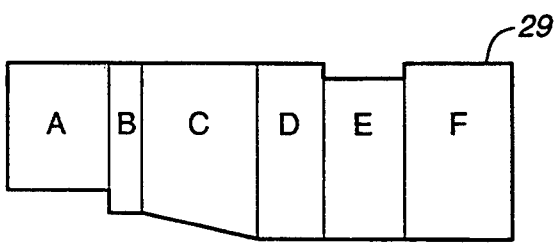
FIG._5

METHOD FOR VERIFYING CIRCUIT LAYOUT DESIGN

BACKGROUND OF THE INVENTION

1. Field of Invention

The present invention relates generally to designing integrated circuits, and more particularly relates to methods for verifying that a given circuit layout design conforms to predetermined design constraints.

2. State of the Art

Generally speaking, techniques are known for verifying that a circuit layout (e.g., standard cell) conforms with predetermined design constraints. For example, design rule checking techniques are known for verifying that the geometries (e.g., conductive or non-conductive paths) included in all layers of a given integrated circuit layout comply with predetermined minimum width requirements. At best, these techniques can verify that all geometries in a given layer of an integrated circuit layout satisfy the minimum width constraint. It is important to verify that all paths in the circuit layout comply with minimum width requirements to avoid problems such as metal migration, voltage division, timing problems and so forth.

There is a continual effort to reduce integrated circuit size, and to increase operational speed. For example, to increase signal processing speed it would be desirable to increase transistor power. This entails providing higher $V_{dd}$ (drain) and $V_{ss}$ (source) currents. Higher $V_{dd}$ and $V_{ss}$ currents require that the paths conducting these currents be designed larger (e.g., wider design specifications) to avoid problems such as metal migration. However, no techniques currently exist for separately verifying proper design of this wider path. That is, no practical way exists for verifying that a path between two arbitrary nodes satisfies predetermined minimum width constraints which are different from minimum width constraints for remaining portions of the circuit layout. Thus, the probability of errors in the design is great.

SUMMARY OF THE INVENTION

The present invention is therefore directed to methods to assist in designing integrated circuits by verifying that design constraints (e.g., minimum path width) are satisfied between two arbitrary nodes of a circuit layout. In an exemplary embodiment, a method for designing an integrated circuit layout by verifying that predetermined design constraints are satisfied for an arbitrary path defined by at least two nodes comprises the steps of labeling all polygons of said integrated circuit layout with a name which corresponds to a layer or layers of the integrated circuit layout, creating a file of polygons which includes polygons located along said arbitrary path, and determining whether polygons located along said arbitrary path satisfy predetermined design constraints specified for that path. For purposes of the present invention, the arbitrary path can be between nodes on one or more layers of the circuit layout and therefore the arbitrary path can include polygons from one or more layers.

BRIEF DESCRIPTION OF THE DRAWINGS

These and other objects and advantages of the present invention will become more apparent from the following detailed description of preferred embodiments when read in conjunction with the accompanying drawings, wherein like elements, are designated by like numerals, and wherein:

FIGS. 1a, 1b, 2a, 2b, 3a and 3b illustrate methods associated with the present invention;

FIG. 4 illustrates a flow chart for implementing an exemplary embodiment of the invention; and FIG. 5 illustrates results associated with the FIG. 4 flow chart.

DETAILED DESCRIPTION OF THE PREFERRED EMBODIMENTS

FIG. 1a shows merged polygons associated with a single layer 2 of an exemplary integrated circuit layout. The geometries 4, 6, 8, 10, and 12 represent disjointed portions of the layer which includes, for example, conductive paths. The geometries shown in FIG. 1a are for the layer which includes node mark 1 and node mark 2, corresponding to nodes 1 and 2 at the locations "x". Each of these geometries represents a combination of one or more polygons which have been previously identified during circuit design. The geometries can include polygons from one or more layers. For example, in FIG. 1a the geometry 8 can include polygons from one or more merged layers associated with the nodes of interest.

Using a standard design verification technique, predetermined design constraints for the integrated circuit, which includes the layer shown in FIG. 1, can be verified. For example, a minimum path width for all geometries represented in FIG. 1 (as well as other layers at the integrated circuit layout) can be verified. However, as described previously, known verification techniques do not permit an arbitrarily specified path between nodes 1 and 2 to be separately verified.

For example, assuming that the path between nodes 1 and 2 is designed to have larger minimum width requirements than other portions of the layer shown, there is no present technique for verifying that this path conforms to these requirements. Accordingly, to verify that the path between nodes 1 and 2 conforms to larger width requirements, all polygons representing the integrated circuit layout are labeled with a name which corresponds to a layer or a combination of layers (e.g., metallization layers) of the integrated circuit layout in which each polygon is located. Such information is typically generated during the design phase of an integrated circuit layout. This information is stored and used to subsequently create a file of polygons which includes those polygons located along the arbitrary path.

The step of creating includes a step of identifying the layer or combination of layers of the integrated circuit layout that includes at least two nodes which define the arbitrary path of interest. Further, the step of creating includes a step of building a file of polygons for the identified layer or layers. The building of a polygon file for this layer or layers of the integrated circuit layout further includes steps of sorting and merging the polygon file to identify those polygons in each of the layers which contact one another. Thus, the polygons of a given layer can be displayed as a plurality of geometries, such as the geometries shown in FIG. 1a.

Afterwards, a separate file of polygons which include only those polygons located along the arbitrary path is created by manually identifying those polygons which constitute part of the path of interest. This separate file can be used to create an overlay layer 14 (e.g., manually draw the area shaded in FIG. 1b) which corresponds to the region to be checked for compliance with minimum width requirements (i.e., the arbitrary path). This overlay layer can then be independently verified for compliance with a minimum width requirement using a standard design rule checking technique, with the minimum width specified corresponding to the larger value set for the path of interest.

The overlay layer does not constitute part of the integrated circuit layout, and is formed by tracing over the widest regions which form the arbitrary path of interest. For example, as shown in FIG. 1b, the overlay layer is created as the superimposed, shaded portion of the FIG. 1a layer which includes the path between nodes 1 and 2. Minimum width requirements of the path between nodes 1 and 2 are verified by using standard design rule verification techniques for the superimposed, shaded portion.

While the visual determination of polygons associated with the FIG. 1b analysis described above may be suitable for relatively simple designs, this technique becomes increasingly inaccurate as circuit layout complexity increases. In some cases, it may be virtually impossible to create an overlay associated with the arbitrary path of interest. Further, it is time-consuming to maintain an updated version of an overlay which will permit accurate verification of the arbitrary path despite ongoing circuit layout design changes. In addition, multiple overlay layers must be created whenever multiple arbitrary paths of interest are involved.

An alternate technique of verifying design constraints for an arbitrary path defined by at least two nodes will now be described. Polygonal and geometrical information associated with a given layer of an integrated circuit is generated in a manner similar to that described with respect to FIG. 1a. To determine whether polygons located along the arbitrary path satisfy predetermined design constraints, the design verification technique is modified as follows.

After the standard design verification technique has been run for the entire integrated circuit, the predetermined design criteria (e.g., minimum path width) is reset to the larger requirement associated with the path between the arbitrary nodes of interest. For example, if the minimum path width for all paths in the circuit layout is 8 units (e.g., microns), but the minimum path width requirement for the path between the nodes of interest is 30 units, the standard design verification technique is run for the layer which includes nodes 1 and 2 using the 30 unit value. Thus, all portions of the layer's geometry, which do not satisfy the 30 unit constraint are sequentially displayed, one at a time, with an error message. If no portions of the geometry which interconnects the nodes of interest are displayed, the minimum width requirements for that path are considered satisfactory.

Although this alternate technique will work in some cases, it can result in the generation of false errors. For example, with regard to FIG. 2a, the geometry which interconnects node 1 and node 2 includes errors which are highlighted in bold in FIG. 2b. As can be seen, a number of portions of the layer geometry, which interconnects nodes 1 and 2, would be displayed such that the user would falsely believe that a path with a continuous 30 units width did not exist between nodes 1 and 2. Thus, the designer must continually verify that any error generated represents an actual error for the path of interest. However, assuming all portions of the layer geometry which do conform with the minimum width requirements (e.g., shaded portion of FIG. 1b) can be independently displayed, the user can visually verify that a path which satisfies the minimum width requirements between nodes 1 and 2 does exist. Such a technique can be performed using the steps described below with respect to FIG. 4.

An alternate technique for verifying that predetermined design constraints are satisfied for an arbitrary path defined by at least two nodes will now be described with respect to FIGS. 3a and 3b. As with FIGS. 1a and 2a, the method associated with FIG. 3a begins by labeling all polygons in the integrated circuit so that the geometries associated with any desired integrated circuit layout can be separately displayed. To determine whether polygons located along a path between arbitrarily specified nodes conform with minimum width requirements for that path, all polygons in the layer which includes the nodes of interest are reduced in size by an amount slightly less than the minimum width requirement. Thus, remaining portions displayed will verify whether a path between the nodes possesses the minimum width requirements, as shown, for example, by the area 16 in FIG. 3b.

Although a technique as described with respect to FIGS. 3a–3b will work in most cases, an error is introduced in the determination. This error is due to the FIG. 3a polygons being reduced in size by an amount slightly less than the desired minimum width as illustrated by the highlighted lines in FIG. 3a.

Because the techniques associated with FIGS. 1–3 include varying degrees of error, an alternate, fully automated, technique will be described with respect to FIGS. 4 and 5. In accordance with the FIG. 4 flow chart, a labeling step 20 similar to that described with respect to FIG. 1a is initiated. Further, a file of polygons for an integrated circuit layout layer which includes those polygons located along the arbitrary path is created (i.e., steps 22 and 24) in a manner similar to that described with respect to FIG. 1a. Thus, the geometry of any integrated circuit layout layer can be identified to produce the FIG. 1a information. However, because a fully automated technique is used for this embodiment, the geometry of a layer which includes the nodes of interest need not be displayed.

After building a file of polygons included in a layer of interest, a determination is made as to whether polygons located along the arbitrary path satisfy predetermined design constraints ((e.g., minimum width requirements), specified for that path. For this purpose, the step of determining includes a step 26 for verifying that all paths defined by the merged polygons in the layer of interest comply with the predetermined design constraints established for the arbitrary path of interest. Any nonconforming geometries represented by portions of the merged polygons which, for example, do not possess the minimum width, are eliminated in step 28. For example, where the path between nodes 1 and 2 possesses a minimum width requirement of 30λ, geometries which do not conform with this requirement are eliminated. Were the results of this step to be displayed, the resulting geometry for the FIG. 1a layer would be as shown by geometry 29 in FIG. 5.

Remaining polygons of the merged geometries in the layer of interest are subsequently labeled in step 30 with a unique index for each unconnected node. For purposes of illustration, the sole remaining geometry shown in FIG. 5 is shown broken down into its original polygon components A, B, C, D, E and F associated with the initial polygon labeling. Using an automated scanning and labeling technique as described in allowed, commonly assigned U.S. Pat. No. 5,113,451, entitled "Method For Labeling Polygons," filed Oct. 16, 1989, the disclosure of which is hereby incorporated by reference in its entirety, root polygons are identified. All connected polygons are then merged to identify any unconnected nodes, each of the unconnected nodes being associated with a unique root polygon index. As shown in FIG. 5, the only polygons remaining after the step of elimination are all connected. Accordingly, the polygons which form the remaining geometry of FIG. 5 would all be associated with a single root polygon index.

Having determined the root index for any remaining geometries, the at least two nodes are located relative to these remaining geometries in step 32. The location of each node is then correlated to a root polygon index for the geometry in which it is located. The unique index for any remaining portion corresponding to a first of the at least two nodes is then compared with the unique index for any remaining portion corresponding to a second of the at least two nodes in step 34.

If the unique indices for any remaining portions corresponding to the first and second nodes match, then polygons exist which interconnect the two nodes and which conform to the minimum width requirements specified for the two nodes. An indication of the verification of a minimum path width for the arbitrary path specified can then be provided to the designer in step 36. Alternately, if the unique indices for any remaining portions corresponding to the first and second nodes do not match, then there is no path between the at least two nodes which complies with the minimum width requirements specified. In this case, an error in the minimum path width can be indicated to the designer in step 36 so that the integrated circuit layout can be redesigned to conform with the design constraints specified.

It will be appreciated by those skilled in the art that the present invention can be embodied in other specific forms without departing from the spirit or essential characteristics thereof. The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. Method for designing an integrated circuit layout by verifying that predetermined design constraints are satisfied for a conductive path between at least two nodes, comprising the steps of:
    labeling all polygons of said integrated circuit layout with a name which corresponds to a layer of the integrated circuit layout; creating a file of polygons which includes polygons located along said conductive path; and determining whether polygons in said file of polygons located along said conductive path satisfy predetermined width constraints specified for that path.

2. Method according to claim 1, wherein said step of creating further includes a step of:
    identifying a layer of said integrated circuit layout which includes said at least two nodes; and
    building a file of polygons included in said layer.

3. Method according to claim 2, wherein said step of building further includes the steps of:
    sorting and merging said file of polygons to identify those polygons which contact one another.

4. Method according to claim 3, wherein said step of determining further includes the steps of:
    verifying those paths defined by said merged polygons in said layer which comply with said predetermined width constraints; and
    eliminating portions of said merged polygons which fail to comply with said predetermined width constraints.

5. Method according to claim 4, wherein said step of determining further includes the step of:
    labeling any remaining portions of said merged polygons with an index for each unconnected node.

6. Method according to claim 5, wherein said step of labeling further includes the step of:
    automatically scanning said remaining portions to identify root polygons; and
    merging all connected polygons to identify any unconnected nodes, each of said unconnected nodes being associated with only one root polygon upon completion of said scanning, with each root polygon representing a unique index.

7. Method according to claim 5, wherein said step of determining further includes the step of:
    locating said at least two nodes relative to said remaining portions; and
    comparing the index for any remaining portion corresponding to a first of said at least two nodes with the index for any remaining portion corresponding to a second of said at least two nodes.

8. Method according to claim 7, further including a step of:
    indicating verification of minimum path width for said conductive path if the unique indices for any remaining portions corresponding to said first and said second nodes match.

9. Method according to claim 7, further including a step of:
    indicating an error in minimum path width for said conductive path if the indices for any remaining portions corresponding to said first and said second nodes do not match.

10. Method for designing an integrated circuit layout by verifying that predetermined design constraints are satisfied for an arbitrary path defined by at least two nodes, comprising the steps of:
    labeling all polygons of said integrated circuit layout with a name which corresponds to a layer of the integrated circuit layout in which each polygon is located.;
    creating a file of polygons located along said arbitrary path; and
    determining whether polygons in said file of polygons located along said arbitrary path satisfy predetermined width constraints specified for that path wherein said step of determining further includes the steps of:
    verifying those paths defined by said merged polygons in said layer which comply with said predetermined width constraints;
    eliminating those portions of said merged polygons which fail to comply with said predetermined width constraints;
    labeling any remaining portions of said merged polygons with an index for each unconnected node;
    locating said at least two nodes relative to said remaining portions; and comparing the index for any remaining portion corresponding to a first of said at least two nodes with the index for any remaining portion corresponding to a second of said at least two nodes.

11. Method according to claim 10, wherein said step of creating further includes a step of:

identifying a layer of said integrated circuit layout which includes said at least two nodes; and building a file of polygons included in said layer.

12. Method according to claim 11, wherein said step of building further includes the steps of:

sorting and merging said file of polygons to identify those polygons which contact one another.

13. Method according to claim 12, wherein said step of labeling further includes the step of:

automatically scanning said remaining portions to identify root polygons; and merging all connected polygons to identify any unconnected nodes, each of said unconnected nodes being associated with only one root polygon upon completion of said scanning, with each root polygon representing one of said indices.

14. Method according to claim 12, further including a step of:

indicating verification of minimum path width for said conductive path if the indices for any remaining portions corresponding to said first and said second nodes match.

15. Method according to claim 12, further including a step of:

indicating an error in minimum path width for said conductive path if the indices for any remaining portions corresponding to said first and said second nodes do not match.

* * * * *